US008299451B2

(12) United States Patent
Udagawa

(10) Patent No.: US 8,299,451 B2
(45) Date of Patent: Oct. 30, 2012

(54) SEMICONDUCTOR LIGHT-EMITTING DIODE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 603 days.

(21) Appl. No.: 12/092,862

(22) PCT Filed: Nov. 2, 2006

(86) PCT No.: PCT/JP2006/322414
§ 371 (c)(1),
(2), (4) Date: Jun. 23, 2008

(87) PCT Pub. No.: WO2007/052840
PCT Pub. Date: May 10, 2007

(65) Prior Publication Data
US 2009/0114900 A1    May 7, 2009

Related U.S. Application Data

(60) Provisional application No. 60/737,377, filed on Nov. 17, 2005.

(30) Foreign Application Priority Data

Nov. 7, 2005  (JP) .................................. 2005-322349
Nov. 16, 2005  (JP) .................................. 2005-331481

(51) Int. Cl.
*H01L 29/15*    (2006.01)
(52) U.S. Cl. ........ 257/13; 257/14; 257/94; 257/E33.028
(58) Field of Classification Search .................... 257/46, 257/189, 190, E21.086, E21.097, E21.108, 257/13–18, 79, 82, 88–103, E33.028, E33.035, 257/E33.001, E21.106
See application file for complete search history.

(56) References Cited

U.S. PATENT DOCUMENTS 6,045,626 A * 4/2000 Yano et al. .................... 148/33.4
(Continued)

FOREIGN PATENT DOCUMENTS

JP    49-122294    11/1974
(Continued)

OTHER PUBLICATIONS

T. Sugii, et al.; "Low-Temperature Growth of B-SiC on Si by Gas-Source MBE"; J. Electrochem. Soc., vol. 137, No. 3, Mar. 1990; pp. 989-992. J. Narayan, et al.; "Domain epitaxy: A unified paradigm for thin film growth"; Journal of Applied Physics; vol. 93, No. 1; Jan. 1, 2003; pp. 278-285.

(Continued)

*Primary Examiner* — Cuong Q Nguyen
*Assistant Examiner* — Yosef Gebreyesus
(74) *Attorney, Agent, or Firm* — Sughrue Mion, PLLC

(57) ABSTRACT

A semiconductor light-emitting diode 20 is provided with a silicon single crystal substrate 201, an intervening layer 203 formed of a Group III nitride semiconductor and stacked on the silicon single crystal substrate 201, and a light-emitting part (205, 206, 207) formed with a p-n-junction hetero-junction structure and stacked on the intervening layer 203. The intervening layer 203 is formed of an aluminum-containing Group III nitride semiconductor. The intervening layer 203 and the light-emitting part (205, 206, 207) have interposed therebetween a superlattice structure 204 formed of a plurality of Group III nitride semiconductor layers that contain aluminum and have mutually different aluminum composition ratios. A DBR film formed of the superlattice structure 204 is enabled to excel in reflectance and enhance the light-emitting property.

6 Claims, 2 Drawing Sheets

U.S. PATENT DOCUMENTS

| | | | |
|---|---|---|---|
| 6,541,797 B1* | 4/2003 | Udagawa | 257/94 |
| 2004/0051107 A1* | 3/2004 | Nagahama et al. | 257/79 |
| 2005/0029528 A1 | 2/2005 | Ishikawa | |
| 2006/0175600 A1* | 8/2006 | Sato et al. | 257/14 |

FOREIGN PATENT DOCUMENTS

| | | |
|---|---|---|
| JP | 55-3834 B2 | 1/1980 |
| JP | 60-173829 A | 9/1985 |
| JP | 4-84486 A | 3/1992 |
| JP | 4-223330 A | 8/1992 |
| JP | 11-040850 A | 2/1999 |
| JP | 2003-142730 A | 5/2003 |
| JP | 2005-056922 A | 3/2005 |

OTHER PUBLICATIONS

A. Yamada, et al.; "Growth of c-GaN on carbonized Si(1 0 0) surfaces"; Journal of Crystal Growth 189/190 (1998); pp. 401-405.

X.H. Zheng, et al.; "Comprehensive analysis of microtwins in the 3C-SiC films on Si(0 0 1) substrates"; Journal of Crystal Growth 223 (2001); pp. 40-44.

H.M. Ng, et al.; "Distributed Bragg reflectors based on AlN/GaN multilayers"; Applied Physics Letters; vol. 74; No. 7; Feb. 15, 1999; pp. 1036-1038.

"New Surfacing Material and Epitaxy"; The Physical Society of Japan; First Edition; Dec. 10, 1992.

* cited by examiner

SEMICONDUCTOR LIGHT-EMITTING DIODE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/737,377 filed Nov. 17, 2005 and Japanese Patent Applications No. 2005-322349 filed Nov. 7, 2005 and No. 2005-331481 filed Nov. 16, 2005 pursuant to 35 U.S.C. §111(b).

TECHNICAL FIELD

This invention relates to a semiconductor light-emitting diode provided with a silicon single crystal substrate, an intervening layer formed of a Group III nitride semiconductor and stacked on the silicon single crystal substrate, and a light-emitting part formed with a p-n junction hetero-junction structure and stacked on the intervening layer.

BACKGROUND ART

Group III nitride semiconductor materials, such as gallium nitride (GaN), have been heretofore used for the purpose of forming light-emitting parts of semiconductor light-emitting devices (semiconductor light-emitting diodes), such as short-wavelength visible Light-Emitting Diodes (LEDs) and Laser Diodes (LDs) (refer to JP-B SHO 55-3834). The expression "light-emitting part of a semiconductor light-emitting device" refers to a region that comprises a light-emitting layer formed of a semiconductor material capable of causing emission of light and a functional layer, such as a clad layer, that is attendant on the light-emitting layer. As one example of the semiconductor material used for the purpose of forming a light-emitting layer, gallium-indium nitride ($Ga_XIn_{1-X}N$ wherein $0 \leq X \leq 1$) has been known (refer to JP-B SHO 55-3834).

The light-emitting part formed of a Group III nitride semiconductor is obtained by using sapphire ($\alpha$-$Al_2O_3$ single crystal) (refer to JP-B SHO 55-3834) or silicon single crystal (silicon) (refer to JP-A SHO 49-122294) as a substrate. On the occasion of forming a Group III nitride semiconductor layer on this substrate, the practice of interposing a buffer layer between these layers with a view to relaxing the lattice mismatch possibly occurring in their interface has been finding general acceptance (refer to JP-A SHO 60-173829). For example, a technique of utilizing a boron phosphide (BP) layer as a buffer layer for the purpose of forming a Group III nitride semiconductor layer on a silicon substrate has been known (refer to JP-A HEI 4-084486).

As means to form a silicon carbide layer as a buffer layer on a silicon substrate, a technique that resides in carbonizing the surface of the silicon substrate has been disclosed (refer to J. Electrochem. Soc. (U.S.A.), Vol. 137, No. 3, 1990, pp. 989-992). It is reported that, on the silicon carbide layer disposed on the surface of a silicon substrate, an aluminum-gallium-indium nitride (AlGaInN) layer of superior quality can be formed (refer to JP-A HEI 4-223330). It is, therefore, inferred that the formation on this layer of a functional layer, such as a Distributed Bragg Reflector (DBR), with the superlattice structure of a Group III nitride semiconductor layer is feasible.

Meanwhile, an example of the conventional technique that forms the DBR layer with a superlattice structure of GaN and AlN where sapphire is used as a substrate has been disclosed (refer to Appl. Phys. Lett. (U.S.A.), Volume 74, No. 7, 1999, pp. 1036-1038).

An attempt to dispose a superlattice structure where an AlN layer stacked on a silicon carbide buffer layer, for example, is used as an under layer entails the problem that the superlattice structure cannot be stably formed so long as this structure is formed of the combination of a GaN thin film and an AlN thin film, which are both Group III nitride semiconductor layers. This is because the GaN thin film possessing a flat surface destitute of pits and exhibiting continuity uniquely oriented toward a specific crystal direction cannot be formed as joined to the AlN thin film due to the condensation of Ga on the AlN film In the case of disposing the superlattice structure formed of Group III nitride semiconductor layers via a silicon carbide buffer layer formed on a silicon substrate as described above, the conventional technique entails the problem that it is incapable of forming this superlattice structure from the Group III nitride semiconductor layers possessing continuity and exhibiting orderly orientation and further incapable of improving the light-emitting property of the semiconductor light-emitting diode.

This invention has been proposed with a view to overcoming the problems encountered by the conventional technique as described above and is aimed at providing a semiconductor light-emitting diode that enables the DBR film formed of a superlattice structure to excel in reflectance and acquire an improved light-emitting property.

DISCLOSURE OF THE INVENTION

To attain the aim mentioned above, the invention provides as the first aspect thereof a semiconductor light-emitting diode provided with a silicon single crystal substrate, an intervening layer formed of an aluminum-containing Group III nitride semiconductor and stacked on the silicon single crystal substrate, a light-emitting part formed with a p-n junction hetero junction structure and stacked on the intervening layer, and a superlattice structure interposed between the intervening layer and the light-emitting part and formed of a plurality of Group III nitride semiconductor layers that contain aluminum and have mutually different composition ratios of aluminum.

In the second aspect of the invention that involves the configuration of the first aspect of the invention, the intervening layer possesses an aluminum composition ratio of $X_1$ ($0<X_1 \leq 1$) and the semiconductor layers of the superlattice structure possess aluminum composition ratios of $X_2$ and $X_3$ not exceeding $X_1$ and mutually differing to satisfy ($0<X_2<X_3 \leq X_1$).

The third aspect of the invention that involves the configuration of the second aspect of the invention further comprises an intermediate layer formed of an aluminum-containing Group III nitride semiconductor and interposed between the intervening layer and the superlattice structure, wherein the intermediate layer possesses an aluminum composition ratio of $X_4$ that is larger than $X_2$ and equal to or smaller than $X_3$ ($0<X_2<X_4 \leq X_3$).

In the fourth aspect of the invention that involves the configuration of any of the first to third aspects of the invention, each of the intervening layer, semiconductor layers of the superlattice structure and intermediate layer is formed of aluminum-gallium nitride.

The fifth aspect of the invention that involves the configuration of any of the first to fourth aspects of the invention further comprises a gamma (γ) phase aluminum film interposed between the silicon single crystal substrate and the intervening layer.

According to the first aspect of the invention, since in the semiconductor light-emitting diode provided with a silicon single crystal substrate, an intervening layer formed of a Group III nitride semiconductor and stacked on the silicon single crystal substrate, and a light-emitting part formed with a p-n junction hetero-junction structure and stacked on the intervening layer, the intervening layer is formed of an aluminum-containing Group III nitride semiconductor and, between the intervening layer and the light-emitting part, a superlattice structure formed of a plurality of Group III nitride semiconductor layers that contain aluminum and have mutually different composition ratios of aluminum is interposed, the superlattice structure is enabled to comprise Group III nitride semiconductor layers excelling in continuity.

According to the second aspect of the invention, since the intervening layer possesses an aluminum composition ratio of $X_1$ ($0<X_1\leq 1$) and the semiconductor layers of the superlattice structure possess aluminum composition ratios of $X_2$ and $X_3$ not exceeding $X_1$ and mutually differing to satisfy ($0<X_2<X_3\leq X_1$), the superlattice structure is enabled to excel in continuity and, when used as a distributed Bragg reflector capable of reflecting an emitted light with high efficiency, allow manufacture of a light-emitting device of high luminance.

According to the third aspect of the invention, since an intermediate layer formed of an aluminum-containing Group III nitride semiconductor is interposed between the intervening layer and the superlattice structure and since the intermediate layer possesses an aluminum composition ratio of $X_4$ that is larger than $X_2$ and equal to or smaller than $X_3$ ($0<X_2<X_4\leq X_3$), the Group III nitride semiconductor layer excelling in continuity can be formed stably and the superlattice structure, when used as a distributed Bragg reflector, allows stable manufacture of a light-emitting device of high luminance.

According to the fourth aspect of the invention, since each of the intervening layer, semiconductor layers of the superlattice structure and intermediate layer is formed of aluminum-gallium nitride, it is made possible to enhance the effect of forming the intermediate layer, etc. formed of aluminum-containing Group III nitride semiconductors advantageous for obtaining the Group III nitride semiconductor layer excelling in continuity, enable formation of the distributed Bragg reflector suitable for reflecting an emitted short-wavelength light with high efficiency, and permit manufacture of a short-wavelength light-emitting device of high luminance.

According to the fifth aspect of the invention, since a gamma (γ) phase aluminum film is interposed between the silicon single crystal substrate and the intervening layer, it is made possible to alleviate the mismatch between the silicon single crystal forming the substrate and the aluminum-containing Group III nitride semiconductor layer and permit formation of the intervening layer with superior quality. Using the intervening layer of superior quality as an under layer results in allowing formation thereon of the superlattice structure formed of a Group III nitride semiconductor layer excelling in crystallinity and consequently permitting manufacture of a light-emitting device of high luminance by using the superlattice structure as a distributed Bragg reflector.

The above and other objects, characteristic features and advantages of the present invention will become apparent to those skilled in the art from the description to be given herein below with reference to the accompanying drawings.

BEST MODE FOR CARRYING OUT THE INVENTION

Figure 1:
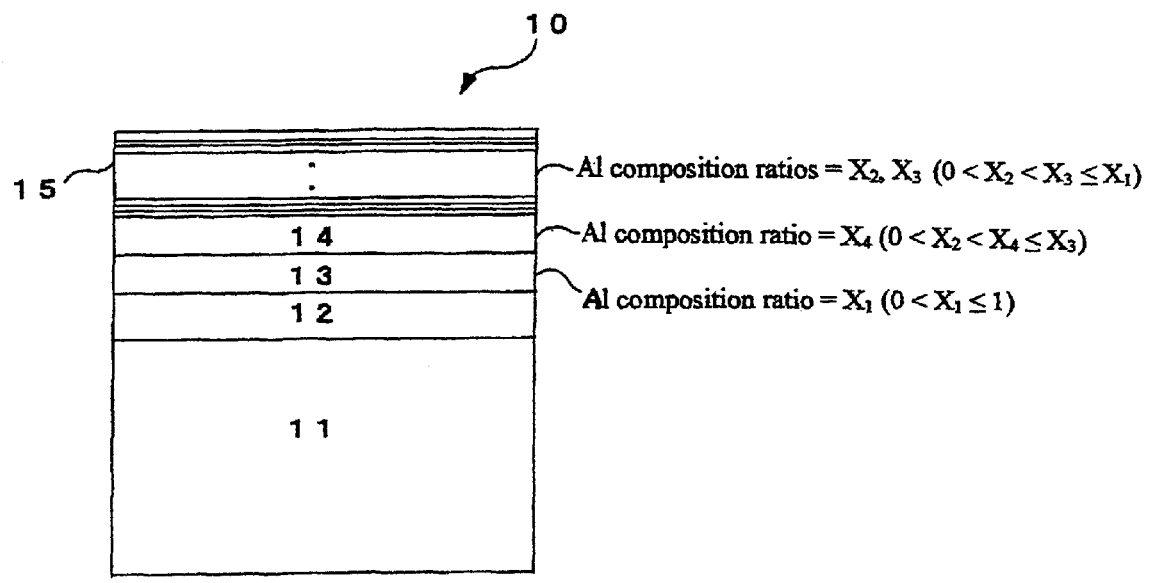
FIG. 1 is a schematic view illustrating the stacked structure contemplated by this invention.

The semiconductor light-emitting diode contemplated by this invention is a semiconductor light-emitting diode provided with a silicon single crystal substrate, an intervening layer formed of an aluminum-containing Group III nitride semiconductor and stacked on the silicon single crystal substrate, a light-emitting part formed with a p-n junction hetero-junction structure and stacked on the intervening layer, and a superlattice structure interposed between the intervening layer and the light-emitting part and formed of a plurality of Group III nitride semiconductor layers that contain aluminum and have mutually different composition ratios of aluminum.

For the purpose of forming an aluminum-containing Group III nitride semiconductor layer as the intervening layer on the silicon substrate, the MetalOrganic Chemical Vapor Deposition (MOCVD) method and Molecular Beam Epitaxial (MBE) method, for example, are available. In the MOCVD method, for example, the aluminum-containing Group III nitride semiconductor layer is formed by using trimethyl aluminum (($CH_3)_3Al$) as an Al source and trimethyl gallium (($CH_3)_3Ga$) as a Ga source, for example.

For example, on the surface of a silicon substrate formed of a {001} or {111} crystal face, a Group III nitride semiconductor layer having an expected Al composition ratio is formed by adjusting the amount of aluminum raw material supplied based on the total amount of the raw materials of Group III component elements. The Al-containing Group III nitride semiconductor layer to be formed on the silicon substrate may be formed of either a wurtzite hexagonal crystal or a zinc blende cubic crystal. In either case, the Group III nitride semiconductor layer of superior quality having an Al composition ratio of $X_1$ ($0<X_1\leq 1$) and possessing continuity destitute of pits can be formed.

By electing the disposition of an Al-containing Group III nitride semiconductor layer as the intervening layer on the silicon substrate via a buffer layer serving to relax the lattice mismatch, it is made possible to obtain the Group III nitride semiconductor layer of still superior quality.

The buffer layer may be formed of silicon carbide (SiC), for example. The buffer layer formed of silicon carbide can be obtained by the Chemical Vapor Deposition (CVD) (refer to X. M. Zheng et al., J. Crystal Growth, 233 (2001), pp. 40-44). Alternatively, a means to carbonize the surface of the silicon substrate by utilizing a hydrocarbon, such as acetylene ($C_2H_2$), is available for this purpose (refer to A Yamada et al., J. Crystal Growth, 189/190 (1998), pp. 401-405).

The silicon carbide layer fated to constitute the buffer layer preferably forms the surface of the silicon substrate in a nearly equal thickness. Particularly, the buffer layer is preferred to be a silicon carbide layer assuming a simple integer ratio to the lattice constant (0.5431 nm) of silicon single crystal. The silicon carbide layer such that the lattice constant ratio of silicon single crystal to the silicon carbide layer falls at 4:5, for example, can be advantageously utilized because it brings a long-term period domain matching with the silicon substrate (refer to J. Narayan, J. Appl. Phys., 93(1) (2003), pp. 278-285). The appearance of the domain matching attained by the silicon carbide layer with the silicon substrate is observed, for example, in a cross-sectional TEM image obtained with a High-Resolution Transmission Electron Microscope (HR-TEM).

Then, the buffer layer may be formed of a metallic Al layer, especially a gamma (γ) phase Al layer. The γ-Al layer can be formed particularly advantageously on a silicon substrate having a (111) crystal face as the surface thereof ((111)-Si). It can be advantageously formed, for example, by growth means, such as the MBE method or Chemical Beam Epitaxial (CBE) growth that forms a film under an environment of high vacuum. In this case, when this formation is implemented after appearance of a (7×7) reconstruction structure (refer, for example, to "Surface New Substance and Epitaxy," compiled and written by The Physical Society of Japan, and published on Dec. 10, 1992 by Baifukan Co., Ltd., first edition, Chapter 8) on the surface of the (111)-Si substrate, the γ-Al layer of superior quality can be produced.

By utilizing the buffer layer as described above, it is made possible to form on this layer a Group III nitride semiconductor layer containing no Al and formed of gallium nitride (GaN), for example. In this case, however, the produced layer lacks continuity and assumes a state having crystal grains scattered. When the Group III nitride semiconductor layer (intervening layer) disposed on the buffer layer is formed of an Al-containing Group III nitride semiconductor layer, it becomes possible to obtain a crystal layer possessing continuity and scarcely containing pits. An aluminum-gallium nitride mixed crystal ($Al_{X1}Ga_{1-X1}N$ wherein $0<X_1\leq1$) excelling in continuity and possessing an Al composition ratio of $X_1$, for example, can be formed. An aluminum nitride (AlN when $X_1=1$) continuous film that is uniquely oriented toward a specific crystal direction of the crystal layer constituting the buffer layer can be also advantageously formed.

Using as an under layer the intervening layer formed of a Group III nitride semiconductor excelling in continuity and having an Al composition ratio of $X_1$ enables formation thereon of a superlattice structure formed of a Group III nitride semiconductor layer excelling in continuity.

The superlattice structure can be also formed of such a Group III nitride semiconductor layer of GaN or a gallium-indium nitride mixed crystal ($Ga_QIn_{1-Q}N$ wherein $0<Q<1$) that contains no Al. Meanwhile, the Al-containing Group III nitride semiconductor layer that uses an Al-containing Group III nitride semiconductor layer as an under layer and is grown thereon scarcely contains pits and excels likewise in continuity. Further, the Al-containing Group III nitride semiconductor layer produced by using an Al-containing Group III nitride semiconductor layer as an under layer excels in the uniqueness of orientation as compared with a GaN layer or a $Ga_QIn_{1-Q}N$ ($0<Q<1$) layer formed on the same under layer.

As a result, the fact that the component layers of the superlattice structure are invariably formed of a Group III nitride semiconductor layer containing Al as a component element wins dominance in obtaining a superlattice structure scarcely containing pits and possessing a flat surface. The superlattice structure that is formed of a Group III nitride semiconductor layer excelling in continuity proves to be dominant in forming a light-emitting part with the p-n junction structure excelling in flatness of the junction interface.

When the superlattice structure is formed by alternately cyclically stacking Group III nitride semiconductor layers exhibiting a continuous and flat surface and having mutually different Al composition ratios, it becomes possible to bring a Distributed Bragg Reflector (DBR) layer that proves to be advantageous for reflecting the emitted light from the light-emitting part with the p-n junction structure, for example, which is disposed thereon.

This superlattice structure is configured, for example, by alternately cyclically stacking a Group III nitride semiconductor layer having an Al composition ratio of $X_2$ and a Group III nitride semiconductor layer having an Al composition ratio of $X_3$ ($X_2<X_3$). Preferably, the component layers have a layer thickness (nm) set at λ/4n (nm). Here, the symbol λ (nm) denotes the wavelength of the light emitted from the light-emitting layer constituting the light-emitting part disposed above the superlattice structure. The symbol n denotes the refractive index at the wavelength λ of the Group III nitride semiconductor layer having an Al composition ratio of $X_2$ or $X_3$. An attempt to give the Al composition ratios $X_2$ and $X_3$ such numerical values as differ from each other as widely as possible in the case of forming the superlattice structure of a DBR layer enables expansion of the bandwidth in which the emitted light is reflected at high reflectivity.

The superlattice structure formed of Group III nitride semiconductor layers having Al composition ratios of $X_2$ and $X_3$ ($X_2<X_3$) can be utilized not only as a DBR layer but also as a structure for relaxation of distortion owing to the difference between the Al composition ratios. The superlattice structure to be used for relaxation of the distortion does not always need to be formed of Group III nitride semiconductor layers having a layer thickness of λ/4n as in the case of forming a DBR layer. The superlattice structure is formed by causing the Al-containing Group III nitride semiconductor layers having Al composition ratios of $X_2$ and $X_3$ to fix their layer thicknesses at a ratio of 1:3, for example. When the Al-containing Group III nitride semiconductor layer having an Al composition ratio of $X_3$ that is larger than $X_2$ is given a larger layer thickness, the superlattice structure to be consequently formed is advantageous for the purpose of relaxation of the distortion.

When the superlattice structure is produced by using the Al-containing Group III nitride semiconductor layer having an Al composition ratio of $X_3$ that is equal to or smaller than $X_1$, i.e. when the superlattice structure is produced by using Group III nitride semiconductor layers having Al composition ratios of $X_2$ and $X_3$ that satisfy the relation of $0<X_2<X_3\leq X_1$, the superlattice structure formed consequently is enabled to avoid sustaining a crack due to distortion.

On the occasion of disposing a superlattice structure on an Al-containing Group III nitride semiconductor layer (intervening layer) having an Al composition ratio of $X_1$, a procedure that comprises further disposing therebetween a Group III nitride semiconductor layer having an Al composition ratio of $X_4$ as an intermediate layer and stacking a superlattice structure thereon results in enhancing the effect of producing more stably the superlattice structure that avoids sustaining a crack. Forming the intermediate layer of an Al-containing Group III nitride semiconductor layer having an Al composition ratio of $X_4$ that exceeds $X_2$ and equal to or smaller than $X_3$ ($X_2<X_4\leq X_3$) proves to be particularly advantageous.

The stacked constitution contemplated by this invention for the purpose of stably producing a superlattice structure sustaining no crack is schematically illustrated in FIG. 1 with reference to Al composition ratios ($X_1$ to $X_4$). A stacked structure 10 is configured by stacking on the surface of (a) a silicon single crystal substrate 11 a superlattice structure 15 composed of (b) a buffer layer 12 formed of γ-Al having a lattice constant close to a Group III nitride semiconductor, such as of AlN, for example, (c) a Group III nitride semiconductor layer (intervening layer) 13 having an Al composition ratio of $X_1$ ($0<X_1\leq 1$), (d) an intermediate layer 14 formed of a Group III nitride semiconductor having an Al composition ratio of $X_4$ ($0<X_2<X_4\leq X_3$), and (e) Group III nitride semiconductor layers having Al composition ratios of $X_2$ and $X_3$ not exceeding $X_1$ and mutually differing to satisfy ($0<X_2<X_3\leq X_1$).

For example, the Group III nitride semiconductor layer (intervening layer) 13 is formed of an AlN layer having an Al composition ratio $X_1$ of 1, the intermediate layer 14 is formed of an $Al_{0.50}Ga_{0.50}N$ layer having an Al composition ratio $X_4$ of 0.50, the superlattice structure 15 is formed of an $Al_{0.05}Ga_{0.95}N$ layer having an Al composition ratio $X_2$ of 0.05 and an AlN layer having an Al composition ratio $X_3$ of 1. Incidentally, this invention does not need to be limited to the constitution of FIG. 1 but may allow the buffer layer 12 and the intermediate layer 14 to be optionally incorporated.

The number of Al-containing Group III nitride semiconductor layers having an Al composition ratio of $X_2$ or $X_3$ which are alternately stacked for the purpose of configuring the superlattice structure, i.e. the number of cycles, is not specified. In the case of the superlattice structure to be used for a DBR, for example, the number of cycles (pairs) is preferred to be such that the emitted light can be reflected with high efficiency. In this case, when an Al-containing Group III nitride semiconductor layer exhibiting as large a refractive index as possible is used as the uppermost surface layer approximating closely to a light-emitting part in the formation of the superlattice structure, the DBR layer possessing high reflectivity can be produced with a small number of cycles. In the case of forming a superlattice structure by alternately stacking $Al_{0.05}Ga_{0.95}N$ and AlN having $X_3$ of 1, for example, a procedure that comprises causing the $Al_{0.05}Ga_{0.95}N$ layer having higher reflectivity than AlN to be disposed as the uppermost surface layer and forming the superlattice structure by performing the alternation up to 20 cycles enables formation of a DBR layer exhibiting reflectivity exceeding 90% with respect to the emitted light having a wavelength of 460 nm.

The construction obtained by disposing a light-emitting part on a superlattice structure functioning as a DBR layer that manifests a function of efficiently reflecting emitted light wins dominance in the fabrication of an LED of high luminance.

EXAMPLE 1

The contents of this invention will be specifically explained below with reference to the case of configuring an LED by utilizing a superlattice structure intended for use as a DBR and formed on a (001) Si single crystal substrate having a (001) crystal face as the surface thereof.

Figure 2:
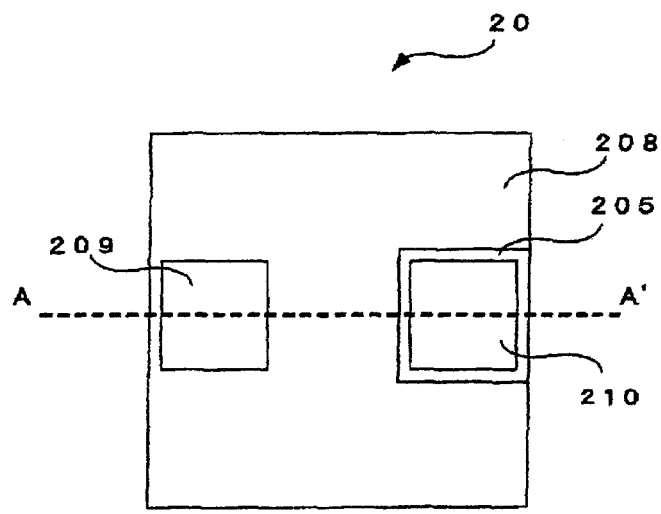
FIG. 2 is a schematic plan view of the LED described in Example 1.
Figure 3:
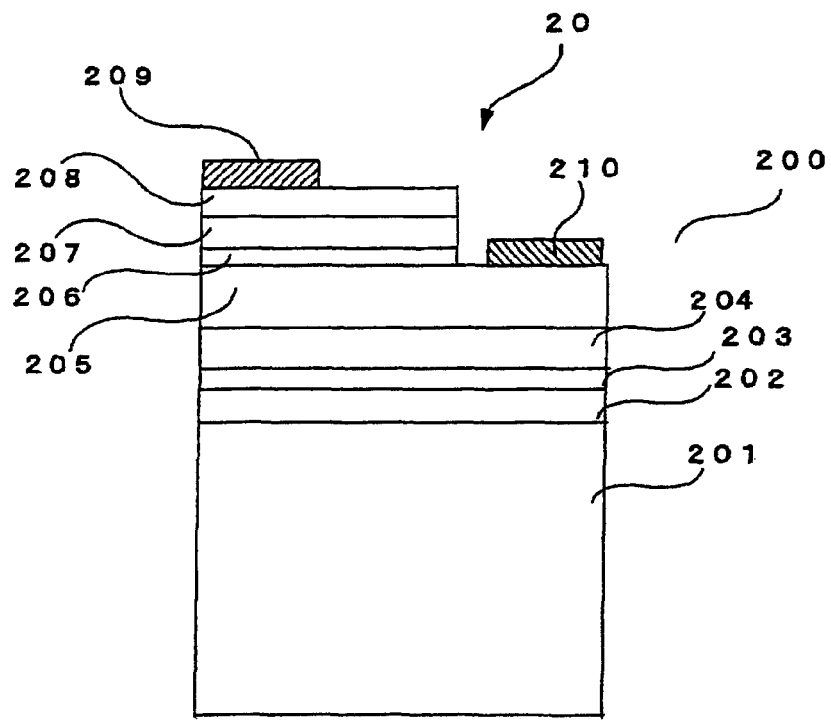
FIG. 3 is a schematic cross-sectional view of the LED taken through FIG. 2 along broken line III-III.

FIG. 2 schematically illustrates the planar structure of an LED 20 pertaining to Example 1 below, and FIG. 3 is a schematic cross-sectional view of the LED 20 taken through FIG. 2 along broken line A-A'.

A stacked structure 200 intended for fabricating the LED 20 was formed by using an n-type silicon (Si) single crystal (silicon) having a (001) crystal face as the surface thereof for a substrate 201. By using an ordinary MBE device, the substrate 201 was heat-treated in a high vacuum at 800° C. to generate a (2×1) reconstruction structure on the surface of the substrate 201. Thereafter, a buffer layer 202 of cubic SiC having a layer thickness of about 2 nm was formed on the surface of the Si substrate 201. Observation of a lattice image produced by a High-Resolution TEM (HR-TEM) showed that in the junction interface between the substrate 201 and the buffer layer 202, the six (001) crystal planes of SiC were domain-matching with the five (001) crystal planes of Si.

On the surface of the SiC buffer layer 202, an intervening layer 203 of an n-type AlN doped with silicon (Si) (an Al-containing Group III nitride semiconductor layer having an Al composition ratio of $X_1$ as described in the text, provided that $X_1$ is 1 in the present example) was formed by an ordinary MBE method. The intervening layer 203 had a layer thickness of about 40 nm.

On the intervening layer 203, a superlattice structure 204 obtained as a DBR layer by alternately stacking an n-type $Al_{0.05}Ga_{0.95}N$ doped with Si and an n-type AlN by an ordinary MBE method was formed. In other words, the superlattice structure 204 was formed of an $Al_{0.05}Ga_{0.95}N$ having an Al composition ratio $X_2$ of 0.05 and an AlN having an Al composition ratio $X_3$ of 1. The superlattice structure 204 for use as a DBR had the layer contiguous to the intervening layer 203 formed of AlN (refractive index: about 2.16) and the uppermost layer formed of an $Al_{0.05}Ga_{0.95}N$ (refractive index=2.43) having a larger refractive index than AlN. With a view to efficiently reflecting the emitted light having a wavelength of 460 nm, the AlN layer and the $Al_{0.05}Ga_{0.95}N$ layer forming the superlattice structure 204 were given layer thicknesses respectively of 53 nm and 47 nm. The number of stacking cycles of the AlN layer and the $Al_{0.05}Ga_{0.95}N$ layer was 20.

Since the AlN layer and the $Al_{0.05}Ga_{0.95}N$ layer forming the superlattice structure 204 were disposed via a Group III nitride semiconductor layer (intervening layer) having a high Al composition ratio $X_1$ of 1, the component semiconductor layers which were ultimately obtained invariably excelled in continuity. When light having a wavelength of 460 nm was perpendicularly injected on the surface of an $Al_{0.05}Ga_{0.95}N$ layer constituting the uppermost layer of the superlattice structure 204, the reflectivity of the superlattice structure 204 for use as a DBR relative to the light of the same wavelength was about 97%.

On the surface of the $Al_{0.05}Ga_{0.95}N$ layer constituting the uppermost layer of the superlattice structure 204, a lower clad layer 205 formed of an n-type $Al_{0.01}Ga_{0.99}N$ layer, a light-emitting layer 206 formed of a Multiple Quantum Well (MQW) structure obtained by repeatedly stacking a pair of an n-type GaN layer and an n-type $Ga_{0.85}In_{0.15}N$ layer up to five cycles, and an upper clad layer 207 formed of a p-type $Al_{0.15}Ga_{0.85}N$ layer were sequentially stacked in the order mentioned by an ordinary MBE method to form a light-emitting part with the p-n junction Double-Hetero (DH) structure. The n-type $Al_{0.01}Ga_{0.99}N$ layer constituting the lower clad layer 205 was given a thickness of 250 nm and the p-type $Al_{0.15}Ga_{0.85}N$ layer constituting the upper clad layer 207 was given a thickness of 90 nm. The barrier layer formed of an n-type GaN layer constituting the light-emitting layer 206 with the MQW structure was given a thickness of 10 nm and the well layer formed of an n-type $Ga_{0.85}In_{0.15}N$ layer was given a thickness of 3 nm.

A contact layer 208 formed of a p-type GaN layer (layer thickness=80 nm) was stacked on the surface of the upper clad layer 207 constituting the light-emitting part with the DH structure to complete the formation of the stacked structure 200 intended for use in the LED 20.

In a partial region of the p-type contact layer 208, a p-type ohmic electrode 209 made of a gold (Au)-nickel oxide (NiO) alloy was formed. Meanwhile, an n-type ohmic electrode 210 was formed on the surface of the lower clad layer 205 exposed by removing the portions of the contact layer 208, upper clad layer 207 and light-emitting layer 206 that existed in the region assigned for the formation of this electrode 210 by a dry etching technique. Thereafter, the LED 20 was fabricated by cutting the completed structure into chips.

The LED 20 was tested for the light-emitting property by causing a device-operating current of 20 mA to flow in the forward direction between the p-type and n-type ohmic electrodes 209 and 210 of the LED 20. The main light emitted from the LED 20 had a wavelength of about 460 nm. The intensity of the emitted light reached a high value of about 1.9 cd because the superlattice structure formed of an Al-containing Group III nitride semiconductor layer was disposed as a DBR layer on an Al-containing Group III nitride semiconductor layer (intervening layer). Owing to the construction such that the light-emitting part with the p-n junction DH structure was disposed on the superlattice structure formed of an Al-containing Group III nitride semiconductor layer excelling in continuity, the light-emitting part could be formed of a Group III nitride semiconductor layer excelling in continuity and, consequently, the LED 20 producing no imhomogeneous light emission and assuming light emission of homegenous intensity could be offered.

EXAMPLE 2

The contents of this invention will be specifically explained below with reference to the case of configuring an LED by utilizing a superlattice structure formed on a (111) Si single crystal substrate having a (111) crystal face as the surface thereof and intended for use as a DBR.

In an ordinary MBE device, an n-type silicon substrate having a (111) crystal face as the surface thereof was heat-treated in a high vacuum at 850° C. to induce emergence of a (7×7) reconstruction structure on the surface of the substrate. Thereafter, an ultrathin film of γ phase aluminum (γ-Al) having a thickness equivalent to about one atomic layer was formed as a buffer layer on the surface of the Si substrate.

On the surface of the γ-Al buffer layer, the same intervening layer formed of an n-type AlN and doped with silicon as described in Example 1 was formed by an ordinary MBE method. On this intervening layer, a superlattice structure obtained as a DBR layer by alternately stacking an n-type $Al_{0.10}Ga_{0.90}N$ doped with Si and an n-type AlN repeatedly by an ordinary MBE method was formed. The superlattice structure was such that the layer contiguous to the intervening layer was formed of AlN (refractive index: about 2.16) and the uppermost surface layer was formed of $Al_{0.10}Ga_{0.90}N$ (refractive index=2.41 higher than that of AlN). With a view to efficiently reflecting the emitted light having a wavelength of 460 nm, Example 2 gave the AlN layer and the $Al_{0.10}Ga_{0.90}N$ layer forming the superlattice structure respective thicknesses of 53 nm and 48 nm. The number of cycles of stacking the AlN layer and the $Al_{0.10}Ga_{0.90}N$ layer was 30.

Since the AlN layer and the $Al_{0.10}Ga_{0.90}N$ layer forming the superlattice structure were disposed via a Group III nitride semiconductor layer (intervening layer) having a high Al composition ratio $X_1$ of 1, the component semiconductor layers which were ultimately obtained invariably excelled in continuity. When light having a wavelength of 460 nm was perpendicularly injected on the surface of an $Al_{0.10}Ga_{0.90}N$ layer constituting the uppermost layer of the superlattice structure fabricated by performing the alternation up to 30 cycles, the reflectivity of the superlattice structure for use as a DBR relative to the light of the same wavelength was about 95%.

On the surface of the $Al_{0.10}Ga_{0.90}N$ layer constituting the uppermost layer of the superlattice structure, a lower clad layer formed of an n-type $Al_{0.05}Ga_{0.95}N$ layer, a light-emitting layer formed of an MQW structure obtained by repeatedly stacking a pair of an n-type GaN layer and an n-type $Ga_{0.85}In_{0.15}N$ layer up to five cycles, and an upper clad layer formed of a p-type $Al_{0.10}Ga_{0.90}N$ layer were sequentially stacked in the order mentioned by an ordinary MBE method to form a light-emitting part with the p-n junction DH structure. The n-type $Al_{0.05}Ga_{0.95}N$ layer constituting the lower clad layer was given a thickness of 200 nm and the p-type $Al_{0.10}Ga_{0.90}N$ layer constituting the upper clad layer was given a thickness of 80 nm. Similarly to Example 1, the barrier layer formed of an n-type GaN layer constituting the light-emitting layer with the MQW structure was given a thickness of 10 nm and the well layer formed of an n-type $Ga_{0.85}In_{0.15}N$ layer was given a thickness of 3 nm.

A contact layer formed of a p-type boron phosphide (BP) layer (layer thickness=190 nm) was further stacked on the surface of the upper clad layer constituting the light-emitting part with the DH structure to complete the formation of the stacked structure intended for use in an LED. The BP layer constituting the contact layer was formed by an ordinary MOCVD method.

In a partial region of the p-type contact layer, a p-type ohmic electrode made of an Au—Zn alloy was formed. Meanwhile, an n-type ohmic electrode was formed on the surface of the lower clad layer exposed by removing the portions of the upper clad layer and the light-emitting layer that existed in the region assigned for the formation of this electrode by a dry etching technique. Thereafter, an LED similar to the LED illustrated in FIG. 2 and FIG. 3 was fabricated by cutting the completed structure into chips.

This LED was tested for the light-emitting property by causing a device-operating current of 20 mA to flow in the forward direction between the p-type and n-type ohmic electrodes of the LED. The main light emitted from the LED had a wavelength of about 460 mm. The intensity of the emitted light reached a high value of about 2.0 cd because the superlattice structure formed of an Al-containing Group III nitride semiconductor layer was disposed as a DBR layer on an Al-containing Group III nitride semiconductor layer (intervening layer) stacked on the γ-Al buffer layer. Owing to the construction such that the light-emitting part with the p-n junction DH structure was disposed on the superlattice structure formed of an Al-containing Group III nitride semiconductor layer excelling in continuity, the light-emitting part could be formed of a Group III nitride semiconductor layer excelling in continuity and, consequently, the LED producing no imhomogenous light emission and exhibiting light emission of homogenous intensity could be offered.

EXAMPLE 3

The contents of this invention will be specifically explained below with reference to the case of configuring an LED by utilizing a metallic Al layer formed on a (111) Si single crystal substrate having a (111) crystal face as the surface thereof and a superlattice structure formed on the Al layer.

Figure 4:
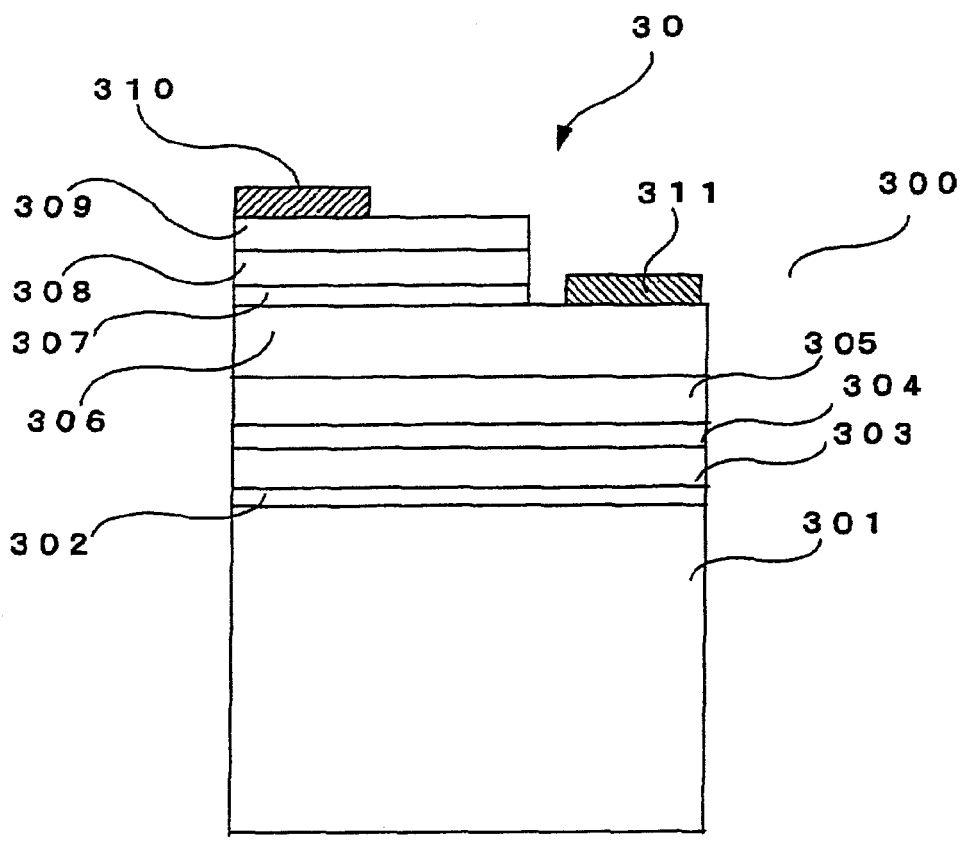
FIG. 4 is a schematic cross-sectional view of the LED described in Example 2.

FIG. 4 schematically illustrates the planar structure of an LED 30 pertaining to Example 3.

On the surface of a (111) crystal face of a silicon substrate 301, a buffer layer 302 formed of an ultrathin film of γ-Al (thickness: about 1 atomic layer) was formed as described in Example 2.

On the buffer layer 302, an intervening layer 303 formed of an n-type AlN and doped with Si (i.e. the Al-containing Group III nitride semiconductor layer having an Al composition ratio of $X_1$ as described in the text, provided that $X_1$ is 1 in Example 3).

On the intervening layer 302, an intermediate layer 304 formed of an $Al_{0.60}Ga_{0.40}N$ layer having an Al composition ratio of 0.60 (which corresponds to a Group III nitride semiconductor layer having an Al composition ratio of $X_4$, provided that $X_4$ is 0.60 in Example 3) was formed by an ordinary MBE method. The intermediate layer 304 was formed of an n-type Si-doped electrically conductive layer having a thickness of about 200 nm.

In the intermediate layer 304, a superlattice structure 305 obtained by alternately repeatedly stacking an n-type Si-doped $Al_{0.10}Ga_{0.90}N$ and an n-type AlN up to 30 cycles as described in Example 2 was formed. The AlN layer and the $Al_{0.10}Ga_{0.90}N$ layer partaking of the superlattice structure 305 were given respective thicknesses of 53 nm and 48 nm as in the case of Example 2.

On the surface of the $Al_{0.10}Ga_{0.90}N$ layer constituting the uppermost layer of the superlattice structure 305, a lower clad layer 306 formed of an n-type $Al_{0.05}Ga_{0.95}N$ layer of the same specification as in Example 2, a light-emitting layer 307 formed of an MQW structure obtained by repeatedly stacking a pair of an n-type GaN layer and an n-type $Ga_{0.85}In_{0.15}N$ layer up to five cycles, and an upper clad layer 308 formed of a p-type $Al_{0.10}Ga_{0.90}N$ layer were sequentially stacked in the order mentioned by an ordinary MBE method to form a light-emitting part with a p-n junction DH junction structure.

A contact layer 309 formed of a p-type BP layer described in Example 2 was stacked on the surface of the upper clad layer 308 constituting the light-emitting part with the DH structure to complete the formation of a stacked structure intended for use in the LED 30.

In a partial region of the p-type contact layer 309, a p-type ohmic electrode 310 made of an Au—Zn alloy was formed as described in Example 2. Meanwhile, an n-type ohmic electrode 311 was formed on the surface of the lower clad layer 305 exposed by removing the portions of the contact layer 309, the upper clad layer 308 and the light-emitting layer 307 that existed in the region assigned for the formation of this electrode 311 by a dry etching technique. Thereafter, an LED 30 was fabricated by cutting the completed structure into chips.

The LED 30 was tested for the light-emitting property by causing a device-operating current of 20 mA to flow in the forward direction between the p-type and n-type ohmic electrodes of the LED 30. The main light emitted from the LED 30 had a wavelength of about 460 nm. The intensity of the emitted light reached a high value of about 2.0 cd because it was made possible to form the superlattice structure 305 serving as a DBR layer from an Al-containing Group III nitride semiconductor layer excelling in continuity and consequently heighten the reflectivity owing to the disposition of the superlattice structure 305 via the Al-containing Group III nitride semiconductor layer (intervening layer) 303 and the intermediate layer 304 formed on the γ-Al buffer layer 302.

Further, owing to the disposition of the superlattice structure 305 on the intermediate layer 304 serving as an under layer, the superlattice structure 305 could be formed of an Al-containing Group III nitride semiconductor layer of a unique orientation such that the [2.-1.-1.0.] crystal orientation thereof was parallel to the [2.-1.-1.0.] crystal orientation of an $Al_{0.65}Ga_{0.35}N$ crystal constituting the intermediate layer 304. As a result, the light-emitting part with the p-n junction DH structure disposed on this superlattice structure could be also formed of a Group III semiconductor layer excelling in continuity and possessing a unified orientation. Thus, the LED 30 producing no imhomogeneous intensity of light emission and exhibiting a light emission of homogenous intensity could be offered.

INDUSTRIAL APPLICABILITY

Since light from the light-emitting layer is not absorbed by the substrate, the light can efficiently be extracted to the exterior. Therefore, it is made possible to provide an LED of high luminance.

The invention claimed is:

1. A semiconductor light-emitting diode comprising:
a silicon single crystal substrate,
an intervening layer formed of an aluminum-containing Group III nitride semiconductor and stacked on the silicon single crystal substrate,
a light-emitting part formed with a p-n junction hetero junction structure and stacked on the intervening layer,
a superlattice structure interposed between the intervening layer and the light-emitting part and formed of a plurality of Group III nitride semiconductor layers that contain aluminum and have mutually different composition ratios of aluminum, and
an intermediate layer formed of an aluminum-containing Group III nitride semiconductor and interposed between the intervening layer and the superlattice structure,
wherein the intervening layer possesses an aluminum composition ratio of $X_1$ $(0<X_1 \leqq 1)$,
the plurality of Group III nitride semiconductor layers of the superlattice structure possess aluminum composition ratios of $X_2$ and $X_3$ not exceeding $X_1$ and mutually differing to satisfy $(0<X_2<X_3 \leqq X_1)$, and
the intermediate layer possesses an aluminum composition ratio of $X_4$ that is greater than $X_2$ and equal to or smaller than $X_3$ $(0<X_2<X_4 \leqq X_3)$.

2. A semiconductor light-emitting diode according to claim 1, wherein each of the intervening layer, and the plurality of Group III nitride semiconductor layers of the superlattice structure is formed of aluminum-gallium nitride.

3. A semiconductor light-emitting diode according to claim 2, further comprising a gamma (γ) phase aluminum film interposed between the silicon single crystal substrate and the intervening layer.

4. A semiconductor light-emitting diode according to claim 1, further comprising a gamma (γ) phase aluminum film interposed between the silicon single crystal substrate and the intervening layer.

5. A semiconductor light-emitting diode according to claim 1, wherein each of the intervening layer, the plurality of Group III nitride semiconductor layers of the superlattice structure, and the intermediate layer is formed of aluminum-gallium nitride.

6. A semiconductor light-emitting diode according to claim 1, wherein a thickness of a semiconductor layer of the plurality of semiconductor layers having an Al composition ratio $X_3$ is greater than a thickness of a semiconductor layer of the plurality of semiconductor layers having an Al composition ratio $X_2$.

* * * * *